United States Patent [19]

Nakagawa

[11] Patent Number: 5,798,284
[45] Date of Patent: Aug. 25, 1998

[54] PROCESS FOR FABRICATING ARRAY OF PHOTOVOLTAIC ELEMENTS CONNECTED IN SERIES

[75] Inventor: Katsumi Nakagawa, Nara, Japan

[73] Assignee: Canon Kabushiki Kaisha, Tokyo, Japan

[21] Appl. No.: 647,730

[22] Filed: May 15, 1996

[30] Foreign Application Priority Data

May 16, 1995 [JP] Japan ................................. 7-117021

[51] Int. Cl.$^6$ ............................. H01L 31/18; H01L 31/20
[52] U.S. Cl. .................. 438/80; 136/244; 136/290; 205/656
[58] Field of Search ................... 437/2–5, 51, 63–64, 437/170, 205, 225; 136/244, 249 MS, 258 AM, 290; 205/687, 766, 656; 438/73, 80, 96

[56] References Cited

U.S. PATENT DOCUMENTS

| | | | |
|---|---|---|---|
| 4,729,970 | 3/1988 | Nath et al. | 437/225 |
| 5,084,400 | 1/1992 | Nath et al. | 437/4 |
| 5,320,723 | 6/1994 | Kawakami | 205/656 |

*Primary Examiner*—Aaron Weisstuch
*Attorney, Agent, or Firm*—Fitzpatrick, Cella, Harper & Scinto

[57] ABSTRACT

Disclosed is a process for fabricating an array of photovoltaic elements connected in series, which can be used as a high-efficiency solar battery, at low cost and with high reliability. The process for fabricating the array of photovoltaic elements connected in series is characterized in that a step ($\alpha$) for forming insulating strips of second electrode material is carried out by immersing in a solution a substrate having a first electrode thereon, and on which the second electrode is deposited, and an opposed electrode of a concentrated electric field type positioned opposite the surface of the second electrode in the vicinity thereof and applying a voltage between the first electrode and the opposed electrode. Further, it is characterized in that a step ($\beta$) for electrochemically passivating electrical defect regions in a photovoltaic layer is carried out by immersing in a solution the substrate having a first electrode thereon, and on which the second electrode is deposited, and a flat-plate-shaped opposed electrode positioned opposite the surface of the second electrode and applying a voltage between the first electrode and the opposed electrode. The process is further characterized in that the step $\alpha$ and the step $\beta$ are carried out at the same time or in succession independently of each other.

27 Claims, 4 Drawing Sheets

5,798,284

PROCESS FOR FABRICATING ARRAY OF PHOTOVOLTAIC ELEMENTS CONNECTED IN SERIES

BACKGROUND OF THE INVENTION

1. Field of the Invention

The present invention relates to a process for fabricating an array of photovoltaic elements connected in series at low cost and with high reliability properties.

2. Related Background Art

There are the following two problems impeding widespread use of solar cells.

(1) Problem of fabricating a large-area array of series-connected photovoltaic elements at low cost.

Single-crystal or polycrystal silicon solar cells have been heretofore often used for solar electric power generation. Such solar cells required a lot of energy and time for crystal growth and complex steps after the crystal growth, which dictates against the economics of volume production, resulting in the problem that they were not provided at a low price.

In order to solve this problem, so-called thin film semiconductor solar cells have actively been researched and developed using compound semiconductors such as amorphous silicon (hereinafter referred to as "a—Si") or $CdS*CuInSe_2$. These solar cells have an excellent possibility of being produced at lower cost because cheap substrates such as glass, stainless steel, or aluminum can be used, a semiconductor layer only functionally necessitated is formed on these substrates, the fabrication steps thereof are relatively simple, and the amounts of semiconductor used are small. Especially, as disclosed in U.S. Pat. No. 4,369,730, a thin plate of a metal with flexibility, such as stainless steel or aluminum, is suitable for continuous mass production of solar cells because it can be used in a roll form.

However, the above-mentioned solar cells generally had a low output voltage of each unit element and thus had the problem that it was necessary to increase the output voltage in most applications by connecting unit elements in series.

In order to solve this problem of the thin film semiconductor solar cells, it became necessary to integrate an array of elements connected in series on a common substrate. The following three patents show examples of solutions to the problem.

(1) U.S. Pat. No. 4,245,386 discloses a series-connected photovoltaic element array comprised of a plurality of first electrode sections, photovoltaic layer sections formed of a thin film semiconductor (with pn junction), and second electrode sections, formed on an electrically insulating substrate.

(2) U.S. Pat. No. 4,292,092 discloses a technique for using a laser beam as a means for dividing an electrically conductive layer or a semiconductor photovoltaic layer.

(3) U.S. Pat. No. 4,697,041 discloses a technique for using a laser beam as a means for accomplishing electrical connection between a first electrode and a second electrode.

Since these methods permit easy division and series connection of each layer, there is a possibility that a series-connected photovoltaic element array can be fabricated at low cost.

However, in a step for forming grooves for electrical insulation in a transparent second electrode, the semiconductor layer present underneath the transparent second electrode absorbs the laser beam. Thus, the semiconductor layer was easily damaged in the step for forming the grooves and there was the problem that it was difficult to set the laser beam at an appropriate intensity.

A method for solving this problem is, for example, disclosed in U.S. Pat. No. 4,697,041, wherein a buffer layer is formed between the semiconductor layer and the second electrode so as to prevent the laser beam from affecting the semiconductor layer.

However, the idea of providing such a buffer layer involved the problem that the process inevitably included additional steps such as printing of strips of the buffer layer and it was difficult to select a material suitable for the buffer layer, taking account of the need for heat resistance in the subsequent processing steps.

(2) Problem of fabricating a large-area array of series-connected photovoltaic elements at a good yield.

Inside a large-area photovoltaic layer there exists defect regions difficult to eliminate. Causes for generation of such defect regions include, for example, extreme irregularities of the surface of the substrate, dust present on the substrate, and dross (a buildup of melted substances) occurring when laser processing is carried out. Especially, there was the problem that an undesirable portion was made electrically conductive between the first electrode and the second electrode which decreased the conversion efficiency of the solar cell.

An example of a method for solving this problem is the one disclosed in U.S. Pat. No. 4,729,970, in which the material of the second electrode is selectively electrochemically modified in the proximity of defect regions to increase the resistance thereof and thereby substantially separate the defect regions from the electrical current paths, thus minimizing the effect on the performance of the entire solar battery.

This method is very effective, but it had the problem of incapability of being carried out because the second electrode was already electrically connected to the first electrode after the structure of the series-connected photovoltaic element array was completed.

The process for fabricating the series-connected photovoltaic element array using the thin film semiconductor, as stated above, included unexpectedly complex steps, which often resulted in problems of low yield, low reliability in long-term use, etc.

The present inventor found that the following problems were likely to occur in the conventional process for fabricating a large-area series-connected photovoltaic element array with laser processing.

(1) The semiconductor layer is modified when the insulating strips (grooves) of the second electrode are formed with a laser beam.

Since the second electrode is formed on the semiconductor layer, the high temperature, occurring when a groove is formed in the second electrode by irradiation with a laser beam, is transferred directly to the semiconductor layer. Especially, when the second electrode is transparent in order for the sunlight to be incident from the top surface side, the second electrode absorbs little of the laser beam but rather transmits it, and the underlying semiconductor layer absorbs the transmitted beam. Therefore, the underlying semiconductor layer is especially likely to be damaged.

The inventor also found that the following problem was likely to occur in inactivating or passivating the defect regions in the semiconductor photovoltaic layer of the series-connected photovoltaic element array.

(2) The defect regions cannot be effectively passivated.

In the process disclosed in U.S. Pat. No. 4,729,970, a device is immersed in an electrolyte solution and an electric current is caused to flow between the device and an opposed electrode, whereby the material (metal oxide film) of the second electrode is modified to increase the resistance by electrochemical action. Since the electric current is far easier to flow in the defect regions than in the normal regions, this action strongly works in the defect regions, while the normal regions of the semiconductor photovoltaic layer experience no substantial modification because of their high resistance. Hence, selective passivation cannot be effected after completion of electric connection between the first electrode and the second electrode. On the other hand, the passivation step of defect regions is more effective when carried out at as late a stage as possible. This means that effective passivation of defect regions cannot be achieved if the electrical connection between the first electrode and the second electrode is made prior to the formation of grooves of second electrode, as was often the case in the conventional processes.

As discussed above, the conventional processes for fabricating the series-connected photovoltaic element array were likely to form defects upon formation of grooves in the second electrode and failed to effectively passivate the defects.

SUMMARY OF THE INVENTION

An object of the present invention is to provide a process for fabricating an array of photovoltaic elements connected in series, which can be used as a high-efficiency solar battery, at low cost and with high reliability, by further developing the process disclosed in U.S. Pat. No. 4,729,970, proposing a novel method for forming the grooves in the second electrode, and improving the step of series connection so as to permit effective passivation of defect regions.

A process for fabricating an array of photovoltaic elements connected in series according to the present invention comprises a step of depositing an electrically conductive layer on a substrate, at least the surface of which has an electrically insulating property, a step of forming grooves in the electrically conductive layer to form a plurality of first electrically divided electrodes, a step of depositing a photovoltaic layer on the first electrodes and in said grooves, a step of depositing a transparent electrode layer on the photovoltaic layer, a step of forming electrically insulating strips located in the transparent electrode layer in the vicinity of the grooves of the first electrodes and in parallel with the grooves of the first electrodes to form a plurality of transparent second electrically divided electrodes, and a step of irradiating a region between a groove of the first electrode and an insulating strip of the second electrode with a laser to form an electrical connection portion in the photovoltaic layer, wherein the step (α) of forming the insulating strips in the second electrodes is effected by immersing in a solution the substrate on which the second electrodes are deposited and an opposed electrode of a concentrated electric field type disposed at a position opposed to the surfaces of the second electrodes and applying a voltage between the first electrodes and the opposed electrode.

The opposed electrode of the concentrated electric field type is preferably a knife-edge-shaped electrode with the angle of the tip being 60 degrees or less or a wire-shaped electrode.

The process for fabricating the array of photovoltaic elements connected in series according to the present invention is characterized in that a step (β) of electrochemically passivating the electric defect regions in the photovoltaic layer is performed by immersing in a solution the substrate on which the second electrodes are deposited and an opposed electrode of uniform electric field type disposed at a position opposed to the surfaces of the second electrodes and applying a voltage between the first electrodes and the opposed electrode.

The opposed electrode of the uniform electric field type is preferably a flat-plate-shaped electrode placed in parallel with the substrate or a roller-shaped electrode placed with the center axis thereof in parallel with the substrate.

In the above-described process for fabricating the series-connected photovoltaic element array, the step α and the step β may be carried out at the same time or in succession independently of each other.

According to the first aspect of the invention, the step (α) for forming the insulating strips of the second electrodes is performed by immersing in the solution the substrate on which the second electrodes are deposited and the opposed electrode of the concentrated electric field type disposed at the position opposed to the surfaces of the second electrodes and applying the voltage between the first electrodes and the opposed electrode, whereby a strong electric field occurs in a concentrated manner between the opposed electrode and a portion (A) of the photovoltaic layer located in the vicinity of the opposed electrode, independent of the amount of defects present in the photovoltaic layer. As a result, a reduction reaction, similar to that described in aforementioned U.S. Pat. No. 4,729,970, proceeds in the portion A to form an insulating strip.

According to another aspect of the present invention, the opposed electrode of the concentrated electric field type is a knife-edge-shaped electrode with the angle of the tip being 60 degrees or less, which can suppress spreading of the insulating strip thus formed. This can prevent sheet resistance from decreasing.

According to still another aspect of the present invention, the opposed electrode of the concentrated electric field type is a wire-shaped electrode, which can suppress spreading of the insulating strip thus formed. In addition, the electric current flowing out into the solution can be restricted within an irreducible minimum range. As a result, especially in the case of a large fabrication apparatus, the necessary power supply may be of a compact size. Since the electric current flows only in the portions intended to form the insulating strips, no effect appears in the other portions of the second electrodes.

According to still another aspect of the present invention, the step (β) for electrochemically passivating the electric defect regions in the photovoltaic layer is performed by immersing in the solution the substrate on which the second electrodes are deposited and the flat-plate-shaped opposed electrode disposed at the position opposed to the surfaces of the second electrodes and applying a voltage between the first electrodes and the opposed electrode, and thus a selective reaction takes place in the portions of the second electrodes in contact with the aforementioned defect regions so as to increase the resistance of the metal oxide of second electrodes. As a result, the resistance-increased portions are separated from the circuitry of the series connected photovoltaic element array, which can minimize the effect of defect portions.

According to still another aspect of the present invention, the opposed electrode of the uniform electric field type is a flat-plate-shaped electrode disposed in parallel with the substrate, which can form an electric field with extremely high uniformity against a flat array of series-connected photovoltaic elements, especially in the case of batch processing. As a result, the electric defect regions can be uniformly passivated across the whole element and unnecessary effects on the normal regions of second electrodes can be minimized.

According to still another aspect of the present invention, the opposed electrode of the uniform electric field type is a roller-shaped electrode with the center axis thereof being placed in parallel with the substrate, which can form an electric field with high uniformity against a rolled substrate kept suspended in a slack state as in the case of processing in the roll-to-roll process. As a result, there is no need to exert a tension on the substrate in the solution in order to keep it in a flat shape. Therefore, the electrode does not need to contact the surface, which eliminates a risk of damaging the surface and which makes it easy to obtain constant processing results even in continuous processing for a long period of time.

According to still another aspect of the present invention, letting α be the step for forming the insulating strips of the second electrodes and β be the step for electrochemically passivating the electric defect regions in the photovoltaic layer, the step α and the step β are carried out at the same time, and, therefore, the opposed electrode of the concentrated electric field type and the opposed electrode of the uniform electric field type can be placed in the same electrolytic cell and the same electrolyte solution can be used therein. If independent power supplies are connected to the associated opposed electrodes, an optimum voltage value can be set for each of step α and step β. As a result, an apparatus associated with the process for fabricating the series-connected photovoltaic element array according to the present invention can be constructed in a compact configuration, and the amount of use of the electrolyte solution can be decreased.

According to still another aspect of the present invention, letting α be the step for forming the insulating strips of the second electrodes and β be the step for electrochemically passivating the electric defect regions in the photovoltaic layer, the step α and the step β are carried out in succession and independently of each other, and optimum conditions can be selected for each of step α and step β. In addition to the voltage values, an optimum electrolyte solution can be selected for each of step α and step β if necessary. When step α and step β are carried out in succession and independently of each other, the order of step α and step β is arbitrary.

Other and further objects, features, and advantages of the present invention will be apparent from the following description.

BRIEF DESCRIPTION OF THE DRAWINGS

DETAILED DESCRIPTION OF THE PREFERRED EMBODIMENTS Array of photovoltaic elements connected in series FIGS. 1A–1D show an example of the array of photovoltaic elements connected in series in the present invention. The following description concerns a flow of basic fabrication steps of the array with reference to the cross-sectional views of FIG. 1A to FIG. 1D.

FIG. 1A shows the state in which a layer of first electrode material 102 is deposited on a surface of substrate 101 and the grooves 103a, 103b as first insulating strips are formed in the layer of the first electrode material 102. These grooves divide the first electrode 102 into electrically insulated sections 102a, 102b, and 102c. Here, the substrate 101 may be either one which is made of an electrically insulating material or one in which an electrically insulating layer is deposited on a surface of an electrically conductive material.

The grooves 103 as first insulating strips may be formed by any method as long as it can form the first electrode sections 102a, 102b, and 102c electrically separated. Specific examples of the method for forming the grooves include the following three types:

(1) A method for forming the grooves by irradiation of the electrode material with a laser beam;

(2) A method for vapor-depositing electrode material using a patterned mask;

(3) A method for forming the grooves by photolithographic processing of a uniformly deposited electrode material.

Instead of the grooves, first insulating strips may be formed by the same method as that for forming second insulating strips, as detailed later, thereby forming a plurality of electrically divided first electrodes.

Figure 1A:
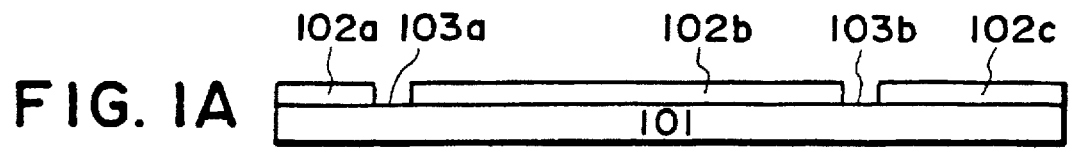
FIGS. 1A, 1B, 1C, and 1D are schematic sectional views showing an example of the process for fabricating the series-connected photovoltaic element array according to the present invention.
Figure 1B:
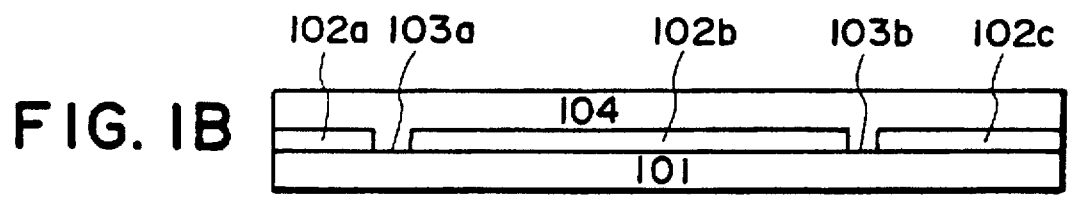

FIG. 1B shows the state in which a photovoltaic layer 104 is deposited so as to completely cover the first electrode 102. The photovoltaic layer 104 is of a structure including a pn junction, a pin junction, a Schottky junction, or the like so as to generate photoelectromotive force.

Figure 1C:
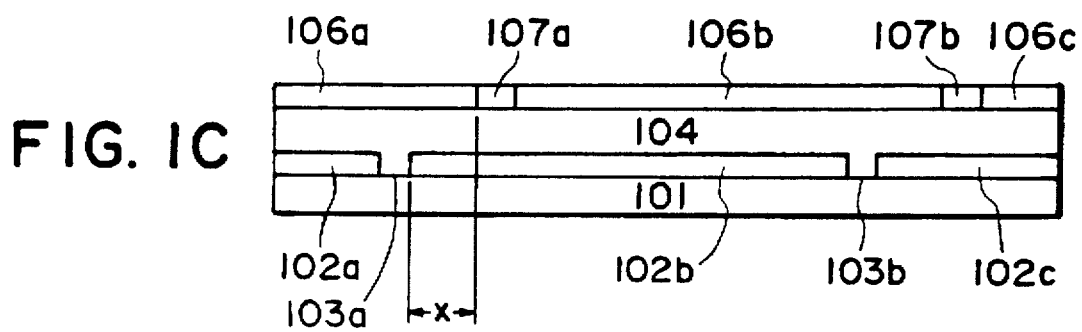

FIG. 1C shows the state in which a layer of second electrode material 106 is deposited so as to completely cover the photovoltaic layer 104 and thereafter second insulating strips 107a, 107b are formed in the layer of second electrode material 106. These insulating strips divide the second electrode material 106 into electrically insulated sections 106a, 106b, and 106c.

The position of the second insulating strip 107a, 107b is shifted by distance x in the in-plane direction (or in the horizontal direction in the plane of the drawing) from the groove 103a, 103b of the first insulating strip.

The second electrode must be a transparent conductive film in order to let the sunlight be incident from the second electrode side. The insulating strips 107 of second electrode can be formed for example by irradiation with a laser beam, but damage to the semiconductor layer 104 easily occurs due to high temperature caused by absorption of the laser beam, as discussed previously. An improvement in this step will be described hereinafter.

Figure 1D:
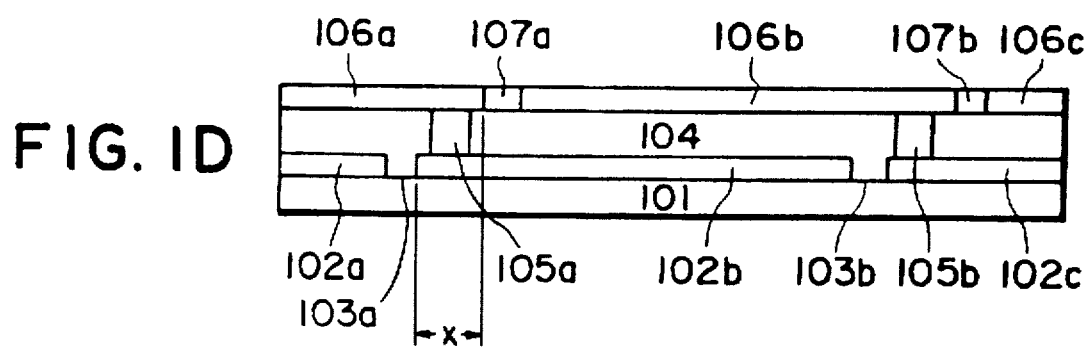

FIG. 1D shows the state in which a connection portion 105a for electrically connecting the first electrode 102b of a first element with the second electrode 106a of a second element is formed in the region of width x. Similarly, a connection portion 105b is also formed for electrically connecting the first electrode 102c of a third element with the second electrode 106b of the first element.

The electrical connection portions 105a, 105b can be formed, for example, by melting the photovoltaic layer 104 by irradiation with a laser beam and then solidifying it to decrease the resistance thereof. Since the regions of the width x do not contribute to generation of photoelectromotive force, they are preferably formed as narrow as possible within the range necessary but sufficient to form the connection portions 105a, 105b.

The portion of the photovoltaic layer 104 immediately below the second insulating strips 107a, 107b may be removed, but, if the photovoltaic layer 104 has some resistance exceeding a certain value in the in-plane direction (in the horizontal direction in the plane of drawing), it is preferably left there as shown.

The connection portion 105 is usually formed by a method of perforating the semiconductor layer to form a hole or groove therein prior to the deposition of second electrode 106 and forming the second electrode in direct contact with the first electrode. This method, however, had the problem that it hindered subsequent passivation of defect regions. The present invention suitably employs the following two methods as measures against it:

(1) A method of forming the second electrode and grooves therein, and thereafter irradiating the photovoltaic layer 104 with a laser beam to crystalize or alloy it with the first electrode so as to decrease the resistance.

(2) A method of forming a hole or groove extending from the second electrode to the first electrode and filling an electrically conductive material inside the hole or groove.

Since the formation of connection portion 105 performed at the final stage of the process is originally a step for achieving electrical conduction between the first electrode and the second electrode, no negative effect will appear in the characteristics even if a new defect region occurs in the vicinity of the connection portion 105. Accordingly, a sufficient effect can be obtained by performing the passivation processing at the same time as the formation of the insulating strips of second electrode, or before or after it.

Second insulating strips

Next described in detail is the method for forming the second insulating strips 107 in the present invention.

U.S. Pat. No. 4,729,970 referred to previously describes the technique for converting the metal oxide used for the second electrode into a high-resistance compound in an electrolyte solution in order to passivate the defect regions.

The reason why the electrolyte solution selectively acts on the defect regions is that an electric current flows at a higher density in the defect regions than in normal regions. It is thus possible to convert a desired region, especially even a portion without a defect, into a high-resistance region if a condition which allows more current to flow can be met. The electrode division of the present invention was accomplished based on this knowledge.

According to this method, the second electrode sections 106a, 106b, and 106c can be electrically separated by the insulating strips. The photovoltaic layer 104 is free from the high temperature damage caused by irradiation with a laser beam and is thus free from degradation of the characteristics.

Since the mechanism of this method is fundamentally the same as the passivation of defect regions, the formation of the insulating strips of the second electrode and the passivation of the defect regions can be performed either at the same time or in succession, which can simplify the process.

Experiments

The process of the present invention as described above can produce the array of series-connected photovoltaic elements with high efficiency and high reliability. Next explained are experiments and results thereof conducted in order to illustrate the principle of the present invention. Numerals in parentheses represent respective steps, and midway step (6) and steps thereafter were changed for each sample (each of Samples A–F).

(1) The substrate 101 employed was stainless steel having a size of 30 cm×30 cm and thickness of 0.2 mm. The substrate of this thickness still maintains sufficient flexibility.

(2) Silane ($SiH_4$) and ethylene ($C_2H_4$) were decomposed by glow discharge to deposit an SiC layer of a thickness of 1 μm as an insulating layer on the substrate 101. Analysis clarified that this film contained approximately 20% of C and had a resistivity of about $10^{14}$ Ωcm.

(3) Ag in a thickness of 0.1 μm was deposited as the first electrode 102 on the insulating layer by sputtering.

(4) With an Nd—YAG laser beam (the second harmonic) grooves 103 were cut in a width of 100 μm in the layer of Ag to divide it into thirty sections each having a width of about 1 cm (laser processing 1).

(5) By glow discharge decomposition the photovoltaic layer 104 of amorphous silicon (a—Si:H) was deposited on the first electrode 102. Here, the semiconductor photovoltaic layer 104 is composed of an e-layer approximately 20 nm thick doped with phosphorus (P), an i-layer approximately 500 μm (=0.5 μm) thick without dopant impurity, and a p-layer approximately 10 μm thick doped with boron (B).

The steps after above step (5) were changed from sample to sample, for each of Samples A–F, as described below.

Sample A (6) ITO (indium tin oxide) was deposited as the second electrode material 106 in a thickness of about 65 nm on the photovoltaic layer 104 by RF sputtering. This second electrode 106 was formed in a predetermined thickness so as to serve also as an anti-reflection film.

(7) With an Nd—YAG laser beam (the fundamental wave) a groove 107 was cut in a width 100 μm in the ITO layer to divide it into sections approximately 1 cm wide (laser processing 2). The groove 103 and groove 107 were shifted approximately 300 μm (=X) from each other.

(8) The region between the groove 103 and the groove 107 was irradiated with the Nd—YAG laser beam (the second harmonic) to form the electrical connection portion 105 for achieving electrical conduction between the first electrode 102 and the second electrode 106 (laser processing 3). In the photovoltaic layer 104 of a—Si:H the portion irradiated with this laser beam presumably decreases in resistance because it is melted and again solidified so as to be crystallized.

(9) The above-mentioned steps were repeated to form an array of thirty photovoltaic elements connected in series (Sample A).

Sample B

Sample B is different from Sample A in that Sample B was subjected to the passivation processing of defect regions before the laser processing 2 stated above. After completion of the passivation processing of the defect regions, the laser processing 2 and laser processing 3 were carried out in order in the same manner as in Sample A, thereby obtaining Sample B. The other steps were the same as those in Sample A.

Figure 2:
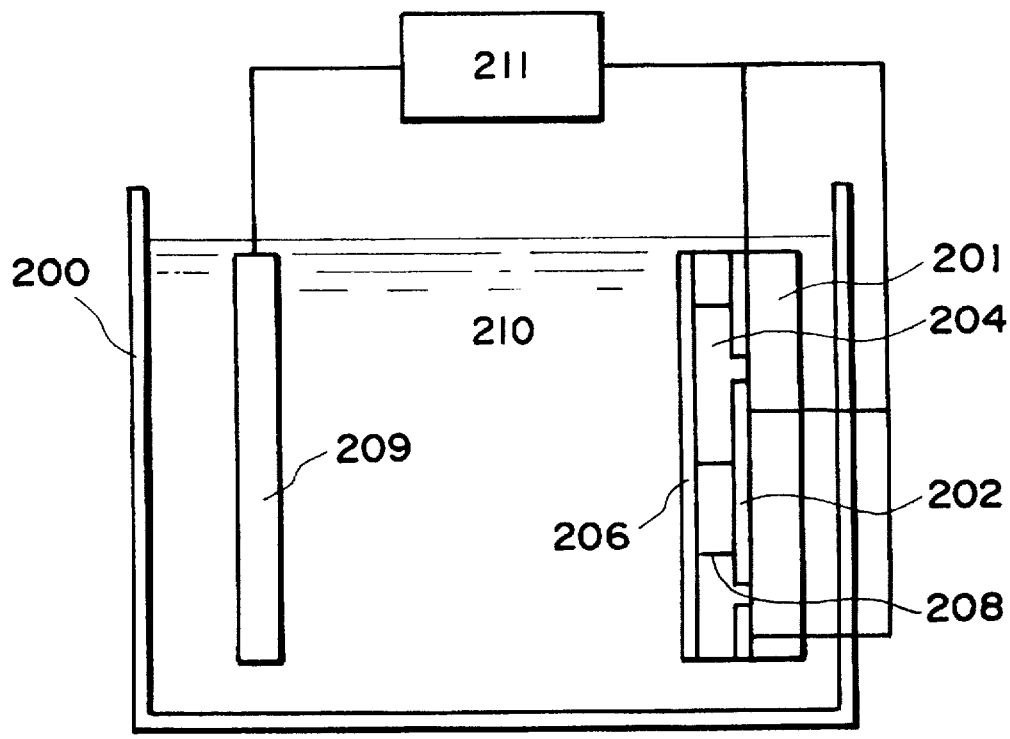
FIG. 2 is a schematic sectional view showing an electrolytic cell for batch processing used for passivating the defect regions in the series-connected photovoltaic element array according to the present invention.

FIG. 2 is a schematic drawing showing an apparatus for carrying out the passivation processing.

In an electrolytic cell 200 containing an electrolyte solution 210 the opposed electrode 209 was positioned opposite to a sample in which the layers up to the second electrode material 206 have been deposited. Then a voltage (normally positive on the sample side) from a do power supply 211 was applied between the sample and the opposed electrode 209.

If the sample has a wide area, many defect regions 208 can exist in the photovoltaic layer 204. Since such defect regions 208 permit the electric current to flow at a higher intensity with respect to the electrolyte solution than normal regions around the defect regions do, a reaction selectively takes place in portions of the second electrode material 206 in contact with the defect regions 208 so as to increase the resistance of the metal oxide material of the second electrode. Since such portions are thus separated from the circuitry of the entire solar battery, influence of the defect regions is minimized.

Sample C

Sample C is different from Sample A in that Sample C was subjected to the passivation processing of the defect regions after completion of the laser processing 2 and thereafter to the laser processing 3. The other steps were the same as those in Sample A.

Sample D

Sample D is different from Sample A in that the insulating strips of second electrode material 406 in Sample D were formed by the method of the present invention described hereinafter.

Figure 4:
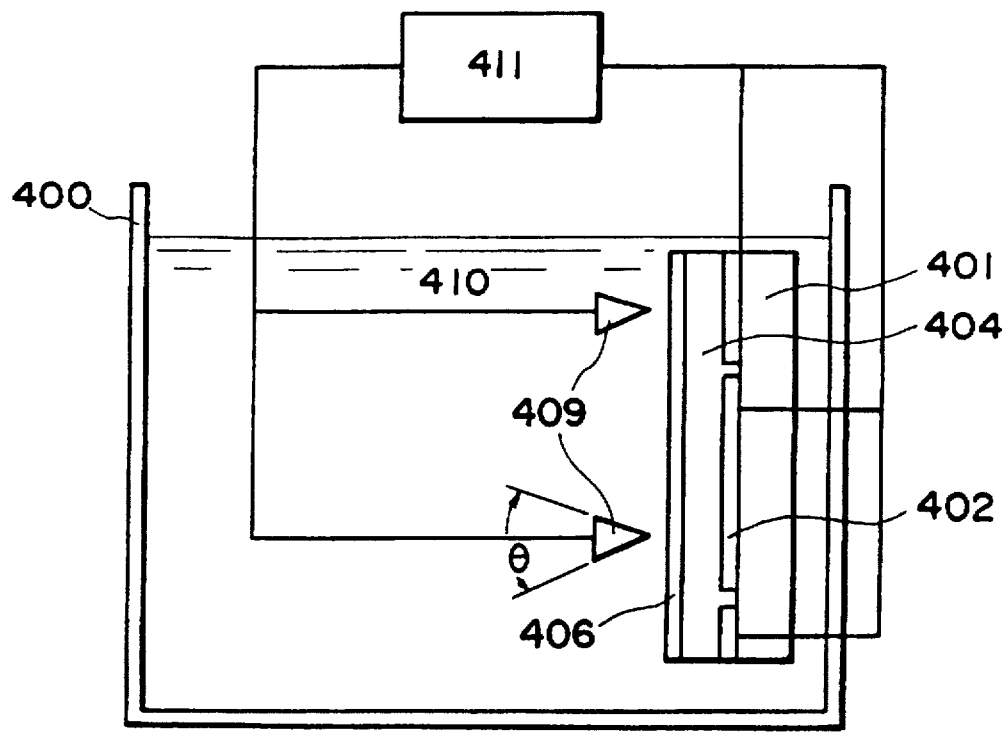
FIG. 4 is a schematic sectional view showing an electrolytic cell for batch processing used for forming the insulating strips of the second electrodes in the series-connected photovoltaic element array according to the present invention.

FIG. 4 is a schematic sectional view of an apparatus used for forming the insulating strips of second electrode material 406. The apparatus of FIG. 4 is different from the apparatus of FIG. 2 in that the opposed electrode 409 is selectively positioned against desired positions near the surface of sample, instead of the flat opposed electrode 209 disposed apart from the sample surface in the apparatus of FIG. 2. The opposed electrode is of a linearly extending knife-edge shape. When the opposed electrode 409 of this type is positioned, a strong, concentrated electric field is formed even on normal regions of the photovoltaic layer 204, relative to the opposed electrode 409, and the reaction proceeds at desired positions of the second electrode material to form the insulating strips (not shown).

Sample D was thus obtained without performing the laser processing 3. Sample D was not subjected to the passivation processing of defect regions.

The knife-edge-shaped opposed electrode 409 is desirably placed in the vicinity of the substrate. To verify this, it was checked how the spread of the insulating strip and the sheet resistance of the second electrode between the insulating strips depended upon the distance x between the tip of electrode and the surface of the sample. The electrolyte solution used herein was an aqueous solution of AlCl3 and the voltage of 2.5 V was applied for five seconds. The spread of the insulating strip is indicated by the width of a portion where a change of interference colors was observed with an optical microscope (which means that the second electrode was affected more or less). The sheet resistance indicates a relative value when the value at x=100 Am is 1.

TABLE 1

| | Spread of insult. strip | Sheet resist. |
|---|---|---|
| 100 μm | approx. 50 μm | 1.0 |
| 300 μm | approx. 150 μm | 1.0 |
| 500 μm | approx. 500 μm | 0.3 |
| 1 mm | approx. 2 mm | 0.02 |
| 2 mm | unclear | 0.0005 |

It was seen from Table 1 that with an increase of the distance x the sheet resistance decreased, so that the function as an insulating strip became inadequate. Although this effect can be compensated to some extent by adjusting the voltage applied or the application time of the voltage, the spread (blur) of the insulating strip increases on the other hand so as to increase the portion not used as a light receiving portion. Thus, the distance x is preferably as small as possible.

Further, a relation was checked between the spread of insulating strip and the sheet resistance of the second electrodes on either side of insulating strip by changing the angle Θ of the tip of the knife-edge-shaped opposed electrode 409 within the range of 10 degrees to 90 degrees. The distance x between the tip of opposed electrode and the surface of sample was fixed at 300 μm. The spread of the insulating strip is indicated by the a width of a portion where a change of interference colors was observed with the optical microscope (which means that the second electrode was affected more or less), and the sheet resistance indicates a relative value when the value at Θ=30 degrees is 1.

TABLE 2

| Angle Θ | Spread of insult. strip | Sheet resist. |
|---|---|---|
| 10° | approx. 150 μm | 1.1 |
| 30° | approx. 150 μm | 1.0 |
| 60° | approx. 300 μm | 0.5 |
| 70° | approx. 1 mm | 0.1 |
| 90° | unclear | 0.0002 |

It was seen from Table 2 that with an increase of angle Θ the sheet resistance decreased and the function as an insulating strip became inadequate. Especially, if e is greater than 60 degrees, the sheet resistance decreases to one tenth or less, which would cause a practical problem. Accordingly, the angle Θ is preferably within 60 degrees.

Sample E

Sample E is different from Sample A in that the passivation processing of defect regions was carried out in the same manner as in Sample B, thereafter the opposed electrode of the flat plate shape 209 was changed to the knife-edge-shaped opposed electrode 409 in the same electrolytic cell to form the insulating strips, and the laser processing 3 was then carried out.

The other steps are the same as those in Sample 1.

Sample F

Sample F is different from Sample A in that after completion of formation of the insulating strips, the opposed electrode 409 was changed to that (209) in the same electrolytic cell to perform the passivation processing of defect regions and then the laser processing 3 was carried out.

The other steps were the same as those in Sample 1.

Table 3 shows results of evaluation of conversion efficiency obtained by measuring photoelectric conversion characteristics of these samples under a solar simulator of AM-1.5. The characteristic ε represents results when the conversion efficiencies measured for the Samples A-F are compared with a conversion efficiency of a standard sample.

The standard sample means a unit element produced in such a manner that the laser processing 1 was omitted, the semiconductor photovoltaic layer 104 of amorphous silicon (a—Si:H) was deposited on an undivided first electrode 102, the second electrode 106 of ITO was deposited thereon with a mask having an aperture of area 1 cm², and the unit element was thus obtained without division, series connection, and passivation processing of ITO.

The series-connected arrays such as Samples A-F have losses of the areas of the grooves of the first electrode material and the insulating strips of the second electrode material (103 and 107 in FIGS. 1A-1D) and the areas of the regions between them. On the other hand, the standard sample has no loss of area. Because of this, Samples A-F, even if their grooves 103, insulating strips 107, and electrical connection portions 105 are produced on an ideal basis, have slightly (approximately 2%) lower conversion efficiencies than that of the standard sample. Samples A-F could include defect regions because of their large area (30×30 cm²), while the standard sample has a very low possibility of including defect regions because of its small area (1 cm²). Accordingly, Samples A-F will have further lower conversion efficiencies than that of the standard sample if the semiconductor is damaged upon formation of the grooves and electrical connections. Therefore, the negative effect of defect regions and the effect of passivation of defect regions can be evaluated by comparing the conversion efficiencies of samples with that of the standard sample.

TABLE 3

| Sample | Steps before deposit of ITO | Passiv. | Div. of ITO | Passiv. | Series connect | Char. ε |
|---|---|---|---|---|---|---|
| A | | — | laser process 2 | — | laser process 3 | Δ |
| B | same as in A | ○ | laser process 2 | — | laser process 3 | Δ |
| C | same as in A | — | laser process 2 | ○ | laser process 3 | ○ |
| D | same as in A | — | process of the invention | — | laser process 3 | ○ |
| E | same as in A | ○ | process of the invention | — | laser process 3 | ◎ |
| F | same as in A | — | process of the invention | ○ | laser process 3 | ◎ |

Evaluation
◎: equivalent to the standard sample (the conversion factor is 95 or more % of that of the standard sample)
○: approximately equivalent to the standard sample (95–80%)
Δ: inferior in characteristics (85–50%)
x: extremely poor in characteristics (50–0%)

From Table 3, the following results were obtained.

(1) A large-area array of photovoltaic elements connected in series will have the degraded characteristic if the grooves of the second electrode are formed by laser processing.

(2) A defect formed by laser processing can be improved by passivation after processing.

(3) No degradation in the characteristic is observed if the insulating strips of the second electrode are formed by the passivation processing.

(4) Defects which existed before formation of the insulating strips of the second electrode can be perfectly removed by the passivation processing.

Next explained are suitable components, production processes, etc. for carrying out the present invention.
Substrate Specific examples of the substrate in the present invention include crystalline substrates of silicon or the like, and electrically insulating substrates using glass, ceramics, or resins such as polyimide. Substrates of various metals can also be used if their surface is covered with an electrically insulating layer. Among them, a stainless steel plate, a plate of galvanized sheet iron, an aluminum plate, a copper plate or the like are suitably applicable because of their relatively low price. These metal plates may be used after being cut into a certain desired shape or in the form of an elongated sheet. In the case of the sheet form the plate can be used in a roll form, e.g. a coil, which is highly compatible with continuous production and which facilitates storage and transportation. The surface of the substrate may be polished or may be intentionally roughened.
Insulating layer In the present invention, if an electrically conductive substrate of a metal or the like is used, the surface thereof must be preliminarily covered with an electrically insulating layer. The insulating layer must have a resistivity of at least $10^{10}$ Ωcm, preferably $10^{12}$ or more Ωcm, even under irradiation with light. The insulating layer also must withstand the temperatures applied during deposition of electrode or semiconductor materials (normally 200° C. or more) and the temperature applied upon processing with a laser beam (momentarily approximately 1000° C.). Because of this restriction, the material for the insulating layer must be selected from appropriate inorganic materials. The thermal conductivity of the insulating layer is a property greatly affecting processibility with a laser. A film of one of these materials can be deposited on the substrate by a method selected from sputtering, plasma CVD, ion plating, etc.

The insulating layer may be formed of two or more layers. Specifically, the first insulating layer may be a material with high thermal conductivity while the insulating layer in contact with the metal layer may be a material with low thermal conductivity. This arrangement can enjoy the following advantages.

(a) Losses are small of the heating due to irradiation with a laser beam upon forming the grooves of the first electrode and transparent conductive layer.

(b) Since the first insulating layer has high thermal conductivity, the first layer itself is resistant to a damage due to heat, and a possibility of electrical conduction between the first layer and the substrate is thus low.

For the same reason as above, the thermal conductivity of the insulating layer may be arranged to be large on the substrate side and to decrease toward the entrance side of light. It can be realized, for example, by changing the content of a substance for changing the thermal conductivity along the direction of film thickness of the insulating layer.
Metal layer A preferable example of the first electrode of the present invention is a metal layer with high reflectivity, for example Ag or Al. The reflectivity, however, does not have to be high for light of shorter wavelength than 0.5 μm, as discussed previously. On the contrary, the reflectivity in this range should rather be low because it facilitates absorption of the laser beam and it is thus convenient for laser processing. From this point of view, Cu is a suitable material. Further, Cu may be alloyed with another material for the purposes of increasing the hardness, enhancing stability under high humidity, etc. Examples of metals alloyed with Cu include Ag, Al, Be, Ni, Sn, Zn, etc., and the composition thereof can be suitably determined in the range of from 0.1 wt % to 30 wt %. A film of these materials can be deposited on a substrate by a method selected from plating, sputtering, plasma CVD, ion plating, etc.

Photovoltaic layer

Specific examples of the semiconductor material forming the photovoltaic layer of the present invention include a—Si:H, a—SiC:H, a—SiGe:H, etc. They can be used in the form of a pin junction or a Schottky junction. Microcrystalline silicon (pc—si) can be used for the p-layer and e-layer in the pin junction.

These semiconductors are formed by glow discharge decomposition using, for example, silane ($SiH_4$), disilane ($Si_2H_6$), silicon fluoride ($SiF_4$), methane ($CH_4$), ethane ($C_2H_.$), or germane ($GeH_4$), and, for introducing a dopant, phosphine ($PH_3$), diborane ($B_2H_6$), boron trifluoride ($BF_3$), or the like can be used. They can also be formed by reactive sputtering using targets of semiconductor elements and introducing hydrogen into the sputtering atmosphere.

The present invention is explained mainly using these a—Si:H based semiconductors, but the present invention can also be suitably carried out using a CdS-CdTe junction, a CdSCuInSe junction, etc. These materials are usually formed by sputtering or baking of paste.

Transparent conductive layer

Specific examples of the material for the transparent conductive layer used for the second electrode material 106 of the present invention include metal oxides such as indium tin oxide (ITO), zinc oxide (ZnO), cadmium oxide (COD), cadmium stannate ($Cd_2SnO_4$), etc.

These materials have such a feature that their resistivity can be decreased to approximately $10^{-4}$ $\Omega$cm. If the film thickness is determined to be ¼ n (where n is the refractive index of the transparent conductive layer) of the wavelength of light to which the solar battery is most sensitive, an anti-reflection effect can also be achieved, which further improves the output power of the photovoltaic elements.

Laser processing

Specific examples of lasers usable for processing in the present invention are YAG laser (principal oscillation wavelength=1.06 μm), $CO_2$ laser (principal oscillation wavelength=10.6 μm), and excimer laser (principal oscillation wavelength=0.19 μm etc.).

Each laser has an oscillation wavelength different from those of the other lasers, and its own characteristics, but the YAG laser is most frequently used for processing of photovoltaic elements. In the case of the YAG laser, in addition to 1.06 μm, the second harmonic (oscillation wavelength=0.53 μm) can also be used in combination with a nonlinear optical element. The YAG laser can be used in continuous oscillation operation, but it is often used in Q switched pulse oscillation operation in order to obtain high peak power. The frequency of Q switched pulse oscillation is normally from about several kHz to several tens of kHz, and pulse duration is approximately 100 nsec. A preferable mode of oscillation is TEM 00 mode because of its good intensity distribution in a beam and ease of use.

Passivation processing and formation of insulating strips

Specific examples of the electrolyte solution for the passivation processing in the present invention include aqueous solutions of chlorides such as $AlCl_3$, $ZnCl_2$, $SnCl_2$, $TiCl_4$, etc. The dc voltage is normally applied with the opposed electrode being positive and the substrate being negative. An appropriate value of the voltage is normally in the range of approximately 2 V to 4 V, depending upon the characteristics of the semiconductor, the type of the metal oxide material used for the second electrode, etc. The period for conduction of the electric current is normally in the range of approximately several seconds to ten seconds, and it can be determined by monitoring the electric current flowing in a sample by means of an ammeter.

Figure 3:
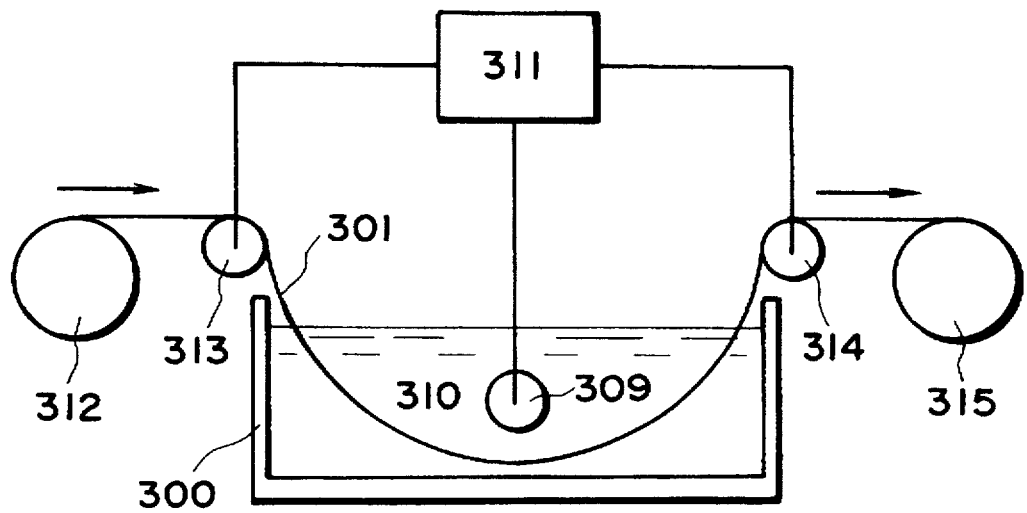
FIG. 3 is a schematic sectional view showing an electrolytic cell for roll-to-roll processing used for passivating the defect regions in the series-connected photovoltaic element array according to the present invention.

The apparatus for performing the passivation processing in batch units has been explained referring to FIG. 2, and an apparatus for performing the same processing in the roll-to-roll method is shown in FIG. 3.

The electrolytic cell 300 is filled with an electrolyte solution 310. The substrate 301 (the upper side of which is a deposition surface) wound around a feed roller 312, after completion of deposition of the second electrode, is fed out at constant speed into the electrolyte solution 310 and thereafter is rolled up around a takeup roller 315. A negative voltage is applied to the substrate through roller electrodes 313 and 314 from the power supply 311. On the other hand, the opposed electrode 309 is disposed in the electrolyte solution and a positive voltage is applied thereto from the power supply 311.

The opposed electrode 309 is of a roller shape for performing the passivation processing in FIG. 3, but, in the case of forming the insulating strips, the opposed electrode may be changed to the one of a knife edge shape or a wire shape with a diameter approximately equal to a desired width of the insulating strip.

Although this figure does not illustrate it, the substrate pulled out from the electrolyte solution is rinsed and then dried before being rolled up.

EXAMPLE 1

Figure 5:
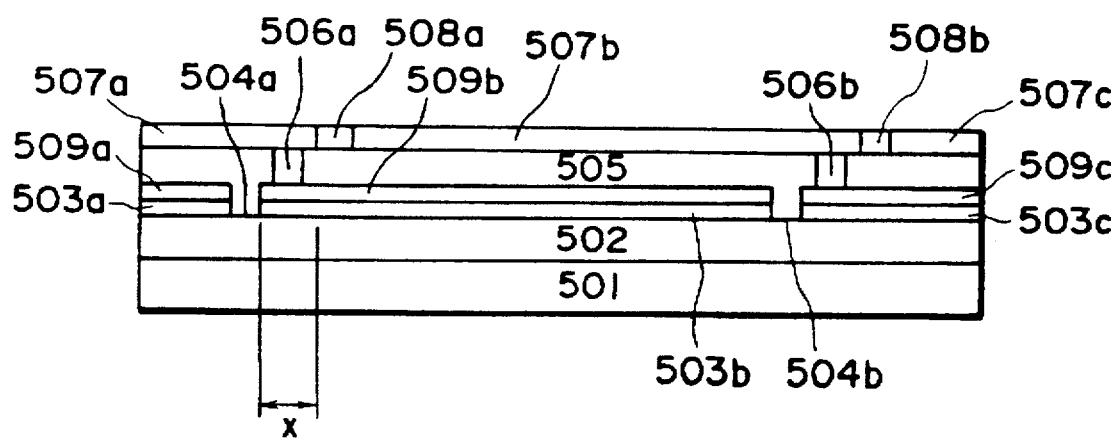
FIG. 5 is a schematic sectional view showing an example of the series-connected photovoltaic element array according to Embodiment 1 of the present invention.

This example is shown to explain an array of photovoltaic elements connected in series in which transparent conductive layers 509a, 509b, and 509c are interposed between the first electrodes 503a, 503b, and 503c and the photovoltaic layer 505, as shown in FIG. 5.

This transparent conductive layer has the following functions:

(a) It optically refracts reflected light from the surface of the first electrode (Ag in this example) to increase the optical pathlength, thereby increasing the output current from the photovoltaic element.

(b) It is provided with a suitable resistance to limit excessive current from flowing in this portion even upon occurrence of a defect region in the photovoltaic layer, thereby suppressing degradation of characteristics of the total photovoltaic element.

The process for fabricating the photovoltaic elements of this example is explained below in accordance with its stepwise procedures.

(1) The substrate 501 used was stainless steel of 30 cm×30 cm size and thickness of 0.2 mm. The substrate 501 was placed in a DC magnetron sputtering apparatus, and a SiC film was formed as an insulating layer 502 in a thickness of 1.0 μm, using a polycrystalline silicon target and sputtering atmosphere gases of argon (Ar), ethylene ($C_2H_4$), and hydrogen ($H_2$).

(2) An Ag film was formed as the first electrode 503 in a thickness of 0.1 μm on the insulating layer 502, using an Ag target and a sputtering atmosphere gas of Ar.

(3) A ZnO film was formed as the transparent conductive layer 509 in a thickness of 1.0 μm on the first electrode 503, using a zinc oxide (ZnO) target and a sputtering atmosphere gas of Ar.

(4) The sample after the formation of the transparent conductive layer 509 was set on a stage of a laser processing machine. With the Nd—YAG laser being oscillated, the stage was moved to scan the sample with the laser beam to cut grooves 504 in a width 100 μm, thereby dividing the layers of ZnO and Ag into thirty sections each of width of about 1 cm. The output of the laser during continuous oscillation was 8 W, the oscillation frequency 4 kHz, and the scanning speed 5 cm/sec.

(5) A photovoltaic layer 505 of amorphous silicon was formed on the sample after completion of step (4). The sample was placed in a plane-parallel capacitive coupled glow discharge apparatus and of n-layer, i-layer, and p-layer films were formed in the named order under the conditions of Table 4. An electron diffraction experiment showed that the p-layer was microcrystallized.

TABLE 4

| Layer | Gases for film | Gas press. (Torr) | Heating Temp of Sample (°C.) | Thick (nm) | Thin film formed |
|---|---|---|---|---|---|
| n layer | $SiH_4$ $PH_3$ $H_2$ | 1 | 200 | 20 | a-Si:H doped with P |
| i layer | $SiH_4$ $H_2$ | 1 | 200 | 400 | a-Si:H |
| p layer | $SiH_4$ $B_2H_6$ $H_2$ | 1 | 150 | 10 | μc-Si:H doped with B |

(6) An ITO film was then deposited as the second electrode 507 in a thickness of about 65 nm on the photovoltaic layer 505, using the DC magnetron sputtering apparatus, an ITO (indium tin oxide) target, and a sputtering atmosphere gas of Ar. The second electrode 507 is formed in such thickness so as to also serve as an anti-reflection film.

(7) The sample after completion of step (6) was placed in the electrolytic cell 400 of FIG. 4 where the second insulating strips 508 were formed. FIG. 4 does not illustrate the insulating layers and transparent conductive layers. An aqueous solution of $AlCl_3$ was used as the electrolyte solution 410. The knife-edge-shaped opposed electrode 409 was fixed at an appropriate position of the surface of the second electrode 406, and a dc voltage of 2.5 V was applied between the first electrode 402 and the opposed electrode 409 for five seconds, with the opposed electrode being positive. This processing converted a linear region of the second electrode 406 opposed to the opposed electrode 409 into an opaque and high-resistance region, thus forming an insulating strip 508. The insulating strips 508 were formed offset about 300 Am (=X) from the grooves 504.

(8) Then the sample was removed from the electrolytic cell and rinsed with pure water and thereafter dried.

(9) Each region between the groove 504 and the insulating strip 508 was irradiated with the Nd—YAG laser beam (the second harmonic) to electrically connect the transparent conductive layer 509 of a first element with the second electrode 507 of a second element. In this example the output of the laser upon continuous oscillation thereof was 3 W, the oscillation frequency 4 kHz, and the scanning speed 5 cm/sec. In the photovoltaic layer 505 of amorphous silicon, the portion irradiated with the laser beam is presumably melted and again solidified so as to be crystallized to decrease their resistance.

(10) The above steps were repeated to produce an array of thirty photovoltaic elements connected in series.

The sample fabricated in this example and the standard sample were evaluated with the solar simulator (AM—1.5 and illuminance of 100 mW/cm²).

Here, a standard sample means a unit element produced in such a manner that the first laser processing was omitted, the semiconductor photovoltaic layer 104 of amorphous silicon (a—Si:H) was deposited on an undivided first electrode 102, the second electrode 106 of ITO was deposited thereon with a mask having an aperture defining an area 1 $cm^2$, and the unit element was thus obtained without division, series connection, and passivation processing of ITO.

As a result of comparison, the conversion factor of the sample produced in this example was approximately 95% of that of the standard sample. On the other hand, another sample was prepared by forming the grooves of the second electrode by irradiation with a laser beam for comparison, and the same evaluation was carried out. The conversion factor in this case was approximately 70% of that of the standard sample. The above evaluation results confirmed that the process for fabricating the array of series-connected photovoltaic elements according to the present invention was an excellent process.

EXAMPLE 2

This example is different from Example 1 in that the step (α) for forming the insulating strips of the second electrode and the step (β) for electrochemically passivating the electrical defect regions in the photovoltaic layer were carried out in succession. The insulating layer 502 in FIG. 5 was composed of two layers.

The process for fabricating the photovoltaic elements of this example will be explained in accordance with its stepwise procedures.

(1) The substrate 501 used was stainless steel of 30 cm×30 cm size and thickness of 0.2 mm. This substrate 501 was placed in the DC magnetron sputtering apparatus, and a SiC film was formed thereon as an insulating layer 502a in a thickness of 0.7 μm, using a polycrystalline silicon target and sputtering atmosphere gases of argon (Ar), ethylene ($C_2H_4$), and hydrogen ($H_2$).

(2) The substrate after completion of step (1) was placed in an RF magnetron sputtering apparatus, and an $SiO_2$ film was formed as an insulating layer 502b in a thickness of 0.3 μm on the insulating layer 502a, using a silica glass target and a sputtering gas atmosphere gas of Ar.

(3) An Ag film was formed as the first electrode 503 in a thickness of 0.1 μm on the insulating layer 502, using an Ag target and a sputtering atmosphere gas of Ar.

(4) A ZnO film was formed as the transparent conductive layer 509 in a thickness of 1.0 μm on the first electrode 503, using a zinc oxide (ZnO) target and a sputtering atmosphere gas of Ar.

(5) In the same manner as in Example 1, the photovoltaic layer 505 was formed on the sample after step (4) and the second electrode 507 was formed on the photovoltaic layer 505. After that, the second insulating strips 508 were formed in the same manner as in Example 1.

(6) The knife-edge-shaped opposed electrodes 409 in the electrolytic cell 400 of FIG. 4 were changed to the flat-plate-shaped opposed electrode, and then the sample after step (5) was placed in the electrolytic cell 400 of FIG. 4. Then a dc voltage of 2.5 V was applied between the opposed electrode and the first electrode 402 for two seconds, with the opposed electrode being positive. This processing resulted in two or three opaque spots appearing on the surface of second electrode 507 and these portions were presumed to be defect regions.

(7) The transparent conductive layer 509 of a first element was electrically connected with the second electrode 507 of a second element, similarly as in Example 1.

(8) The above steps were repeated to produce an array of thirty photovoltaic elements connected in series.

The sample produced in this example and the standard sample prepared in the same manner as in Example 1 were evaluated with the solar simulator (AM-1.5 and illuminance of 100 mW/cm$^2$).

The results showed that the conversion factor of the sample produced in this example was approximately 98% of that of the standard sample. On the other hand, another sample was prepared by forming the grooves 508 of the second electrode by irradiation with a laser beam, and was evaluated in the same manner for comparison. The conversion factor of this sample was approximately 70% of that of the standard sample. The above evaluation results confirmed that the process for fabricating the series-connected photovoltaic element array of the present invention was an excellent process.

EXAMPLE 3

Figure 6:
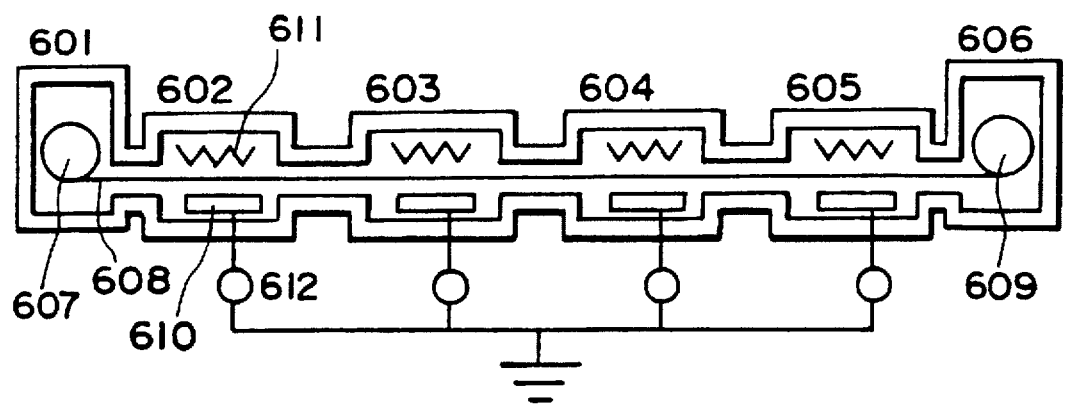
FIG. 6 is a schematic sectional view showing a sputtering apparatus of the roll-to-roll type used for fabricating the series-connected photovoltaic element array according to the present invention.

In this example, a roll-to-roll sputtering apparatus shown in FIG. 6 was used to investigate a continuous process for fabricating the series-connected photovoltaic element array formed with the structure of FIG. 5. The insulating layer 502 was composed of a plurality of layers.

The process for fabrication of the photovoltaic elements of this example will be explained in accordance with its stepwise procedures.

(1) The substrate used was stainless steel 30 cm wide, 0.1 mm thick, and 1000 m long, rolled in a coil form after being cleaned with an alkaline cleaning fluid (at a temperature of 60° C.), rinsed with ion-exchanged water, and dried under warm air.

(2) The layers from the insulating layer 502 to the transparent conductive layer 509 were formed under the conditions shown in Table 4, using the roll-to-roll sputtering apparatus shown in FIG. 6. In this apparatus, the substrate of stainless steel placed in a feed-out chamber 601 and was fed out at constant speed from the roll 607 and rolled up on a roll 609 in a takeup chamber 606.

(3) In a deposition chamber 602 an RF voltage from power supply 612 was applied to an aluminum target 610 and the substrate 608 was heated at 300° C. from the back side by heater 611 under a sputtering atmosphere gas of argon (Ar), and an alumina film was formed as an insulating layer 502a in a thickness of 0.7 μm.

(4) In a deposition chamber 603 a MgF$_2$ film was formed as an insulating layer 502b in a thickness of 0.3 μm, using a magnesium fluoride (MgF$_2$) target and a sputtering atmosphere gas of Ar. The electrode and heater arrangement in the deposition chamber 603 is the same as in the deposition chamber 602.

(5) In a deposition chamber 604 an Ag film was formed as the first electrode 503 in a thickness of 0.1 μm, using an Ag target and a sputtering atmosphere gas of Ar.

(6) Further, in a deposition chamber 604 a ZnO film was formed as the transparent conductive layer 509 in a thickness of 1.0 μm, using a zinc oxide (ZnO) target and a sputtering atmosphere gas of Ar. The substrate after film formation of the transparent conductive layer 509 was rolled up on the takeup roll 609.

(7) The roll 609 after being rolled up was again rewound and conveyed to scan the surface of the transparent conductive layer 509 widthwise of the substrate with a beam of a Nd—YAG laser. With pulse oscillation synchronized with the scanning, grooves 504 were cut in a width of 100 μm extending in the longitudinal direction of the substrate, thereby dividing the ZnO and Ag layers into thirty sections at intervals of about 1 cm. At this time, the output of the laser upon continuous oscillation was 20 W, the oscillation frequency 4 kHz, and the conveying speed of substrate 5 cm/sec.

(8) Then a tandem photovoltaic layer 505 was deposited using the roll-to-roll glow discharge deposition apparatus, as disclosed in U.S. Pat. No. 4,369,730.

The tandem photovoltaic layer 505 is of a laminated structure composed of a bottom cell using amorphous silicon germanium (a—SiGe:H), deposited under a flow of SiH$_4$*Hz and germane (GeH$_4$), as an I-layer and a top cell using amorphous silicon (a—Si:H) as an I-layer. The tandem photovoltaic layer can efficiently utilize sunlight incident thereon because the top cell absorbs mainly those wavelengths shorter than 500 nm while the bottom cell absorbs wavelengths longer than 500 nm not absorbed by the top cell. Since the two cells are connected in series, the layer can provide a high output voltage.

(9) Again using the roll-to-roll sputtering apparatus (in only one deposition chamber), an ITO film was formed as the second electrode 507 in a thickness of about 65 nm, using the ITO (indium tin oxide) target and sputtering atmosphere gas of Ar.

(10) The takeup roll 609 was placed in the electrolytic cell shown in FIG. 3 as supply roll 312. On this occasion, twenty nine knife-edge-shaped opposed electrodes 309 were arranged at intervals of approximately 1 cm relative to the surface of the second electrode 507 and a dc voltage of 3.0 V was applied between the opposed electrodes and the first electrode with the opposed electrodes being positive. This processing formed the insulating strips 508 in a width 100 μm extending in the longitudinal direction of substrate. The ITO layer forming the second electrode 507 was thus divided into thirty sections each having a width of about 1 cm. At this time, the insulating strips 508 were formed offset approximately 300 μm (=X) from the grooves 504.

(11) The wound up roll 609 was then conveyed so as to scan the surface with the laser beam (the second harmonic) of the Nd—YAG laser widthwise of substrate. With pulse oscillation synchronized with the scanning, the transparent conductive layer 509 of a first element was electrically connected with the second electrode 507 of a second element. At this time, the power of laser upon continuous oscillation was 10 W and the oscillation frequency was 4 kHz.

(12) The above steps were repeated to produce an array of thirty photovoltaic elements connected in series.

(13) The roll after completion of the laser processing was cut into lengths of 30 cm, thereby obtaining arrays of photovoltaic elements connected in series in this example.

The samples thus produced in this example and the standard sample were evaluated with the solar simulator (AM—1.5 and illuminance of 100 mW/cm$^2$).

Here, the standard sample means a unit element produced in such a manner that the first laser processing was omitted, the semiconductor photovoltaic layer 104 of amorphous silicon (a—Si:H) deposited on the first electrode 102 was not divided, the second electrode 106 of ITO was deposited thereon with a mask having an aperture of area 1 cm$^2$, and the unit element was thus obtained without division, series connection, and passivation processing of ITO.

The results showed that conversion factors of 96% of the samples produced in this example had approximately 95% of the conversion factor of the standard sample. The above evaluation results confirmed that the series-connected photovoltaic element array of the present invention was also suitable for mass production.

EXAMPLE 4

This example is different from Example 2 in that the step (α) for forming the insulating strips of the second electrode and the step (β) for electrochemically passivating the electrical defect regions in the photovoltaic layer were carried out at the same time. An apparatus shown in FIG. 7 was used for performing the two steps at the same time.

Figure 7:
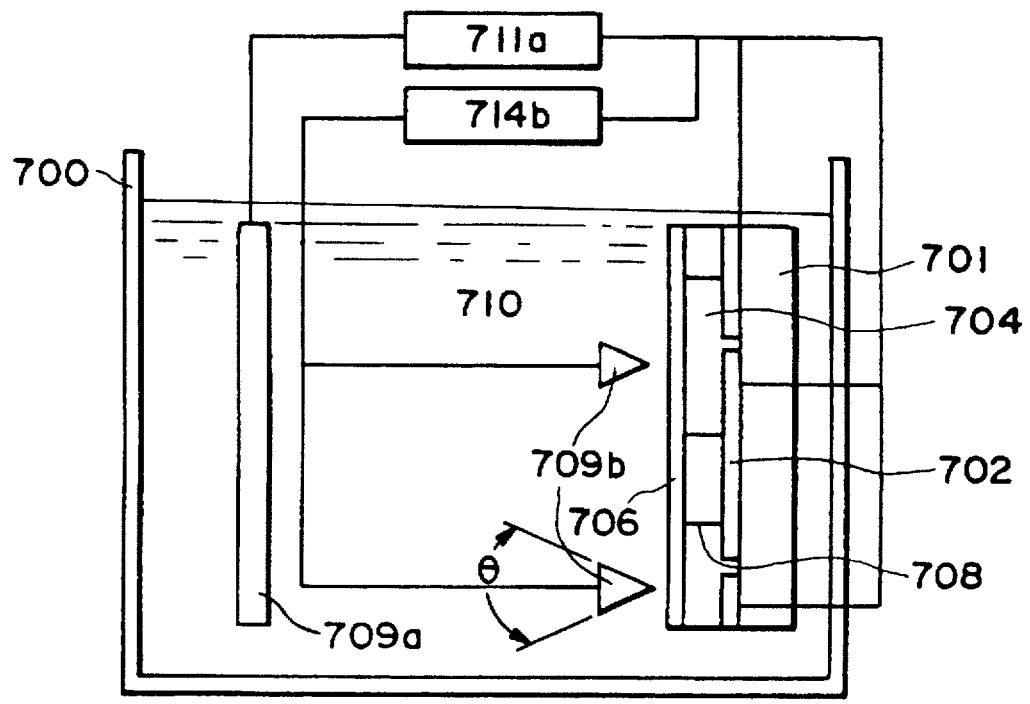
FIG. 7 is a schematic sectional view showing an electrolytic cell for batch processing used for fabricating the series-connected photovoltaic element array according to Embodiment 4 of the present invention.

The apparatus of FIG. 7 incorporates the flat-plate-shaped opposed electrode 709a and the knife-edge-shaped shaped opposed electrode 709b, which are each connected to independent power supplies 714a and 714b, respectively. A voltage of 2 V from power supply 714a and a voltage of 2.5 V from power supply 714b were applied for five seconds at the same time. As a result, the formation of the insulating strips 508 of second electrode and the passivation processing were performed at the same time.

The other steps, which are the steps before and after the simultaneous performance of the above steps α and β, were the same as those in Example 2. Here, the steps before the simultaneous performance of the above steps α and β include the steps up to the formation of the second electrode 507. Further, the steps after the simultaneous performance of the above steps α and β include the steps including the step for electrically connecting the transparent conductive layer 509 with the second electrode 507 and the subsequent steps.

The sample thus produced in this example and the standard sample produced in the same manner as in Example 1 were evaluated with the solar simulator (AM-1.5 and illuminance of 100 mW/cm$^2$).

The results showed that the conversion factor of the sample produced in this example was approximately 97% of that of the standard sample. On the other hand, another sample was prepared by forming the grooves 508 of second electrode by irradiation with laser beam for comparison, and the sample was evaluated in the same manner. The conversion factor of this sample was approximately 70% of that of the standard sample. These evaluation results confirmed that an excellent array of series-connected photovoltaic elements was able to be attained even by the process including the simultaneous performance of the step (α) for forming the insulating strips of the second electrode and the step (β) for electrochemically passivating the electrical defect regions in the photovoltaic layer. Therefore, the number of man hours can be reduced, thus providing a process for fabricating the array of series-connected photovoltaic elements at low cost.

What is claimed is:

1. A process for fabricating an array of photovoltaic elements connected in series, comprising:

a step of depositing an electrically conductive layer on a substrate, at least the surface of which is electrically insulating;

a step of forming grooves in the electrically conductive layer to form a plurality of electrically divided first electrodes;

a step of depositing a photovoltaic layer on the first electrodes and in said grooves;

a step of depositing a transparent electrode layer on the photovoltaic layer;

a step of forming insulating strips in the transparent electrode layer in parallel with the grooves and at positions a predetermined planar distance apart from immediately above said grooves in the electrode layer to form a plurality of electrically divided second electrodes; and a step of forming electrical connection portions in parts of said photovoltaic layer for connecting the first electrodes with the second electrodes of adjacent elements;

wherein the step for forming said insulating strips is carried out by immersing in a solution the substrate on which the transparent electrode layer is deposited and an opposed electrode of a concentrated electric field type disposed in the vicinity of the surface of the transparent electrode layer and applying a voltage between said first electrodes and said opposed electrode.

2. A process for fabricating an array of photovoltaic elements connected in series, comprising:

a step of depositing an electrically conductive layer on a substrate, at least the surface of which is electrically insulating;

a step of forming grooves in the electrically conductive layer to form a plurality of electrically divided first electrodes;

a step of depositing a photovoltaic layer on the first electrodes and in said grooves;

a step of depositing a transparent electrode layer on the photovoltaic layer;

a step of forming insulating strips in the transparent electrode layer in parallel with the grooves and at positions a predetermined planar distance apart from immediately above said grooves in the electrode layer to form a plurality of electrically divided second electrodes; and a step of forming electrical connection portions in parts of said photovoltaic layer for connecting the first electrodes with the second electrodes of adjacent elements;

wherein the step (α) for forming said insulating strips is carried out by immersing in a solution the substrate on which the transparent electrode layer to form said insulating strips is deposited and an opposed electrode of a concentrated electric field type disposed in the vicinity of the surface of the transparent electrode layer and applying a voltage between said first electrodes and said opposed electrode, and wherein a step (β) for passivating electric defect portions of said photovoltaic layer is carried out by immersing in a solution the substrate on which the photovoltaic layer having said electric defect portions is deposited and an opposed electrode of a uniform electric field type disposed in the vicinity of the surface of the substrate and applying a voltage between said first electrodes and the opposed electrode.

3. A process for fabricating an array of photovoltaic elements connected in series according to claim 2, wherein said opposed electrode of the uniform electric field type is a flat-plate-shaped electrode.

4. A process for fabricating an array of photovoltaic elements connected in series according to claim 2, wherein said opposed electrode of the uniform electric field type is a cylindrical electrode.

5. A process for fabricating an array of photovoltaic elements connected in series according to claim 2, wherein said steps (α) and (β) are carried out at the same time.

6. A process for fabricating an array of photovoltaic elements connected in series according to claim 2, wherein said steps (α) and (β) are carried out in succession.

7. A process for fabricating an array of photovoltaic elements connected in series according to claim 1 or claim 2, wherein said opposed electrode of the concentrated electric field type is a knife-edge-shaped electrode.

8. A process for fabricating an array of photovoltaic elements connected in series according to claim 7, wherein the angle of the tip portion of said knife-edge-shaped electrode is 60 degrees or less.

9. A process for fabricating an array of photovoltaic elements connected in series according to claim 1 or claim 2, wherein said opposed electrode of the concentrated electric field type is a wire-shaped electrode.

10. A process for fabricating an array of photovoltaic elements connected in series according to claim 1 or claim 2, wherein said solution or each said solution is an aqueous solution of a chloride.

11. A process for fabricating an array of photovoltaic elements connected in series according to claim 10, wherein said chloride is selected from aluminum chloride, zinc chloride, tin chloride, and titanium chloride.

12. A process for fabricating an array of photovoltaic elements connected in series according to claim 1 or claim 2, wherein the distance between said opposed electrode of the concentrated electric field type and the surface of the transparent electrode layer is 300 or less μm.

13. A process for fabricating an array of photovoltaic elements connected in series according to claim 1 or claim 2, wherein the step for forming grooves in said electrically conductive layer comprises irradiation with a laser beam.

14. A process for fabricating an array of photovoltaic elements connected in series according to claim 1 or claim 2, wherein the step for forming grooves in said electrically conductive layer comprises vapor-depositing said electrically conductive layer on the substrate using a patterned mask, thereby forming grooves in the pattern of said mask.

15. A process for fabricating an array of photovoltaic elements connected in series according to claim 1 or claim 2, wherein the step for forming said grooves comprises performing photolithography processing on a uniformly deposited electrically conductive layer, and thereby forming grooves therein.

16. A process for fabricating an array of photovoltaic elements connected in series according to claim 1 or claim 2, wherein the step for forming said electrical connection portions comprises irradiation with a laser beam.

17. A process for fabricating an array of photovoltaic elements connected in series according to claim 1 or claim 2, wherein the step for forming said electrical connection portions comprises forming holes or grooves extending from said second electrodes of one element to said first electrodes of an adjacent element and filling an electrically conductive material inside said grooves.

18. A process for fabricating an array of photovoltaic elements connected in series according to claim 1 or claim 2, wherein said substrate the surface of which is electrically insulating is obtained by forming an insulating layer on an electrically conductive substrate.

19. A process for fabricating an array of photovoltaic elements connected in series according to claim 18, wherein said insulating layer selected from silicon carbide, silica glass, aluminum oxide, and magnesium fluoride.

20. A process for fabricating an array of photovoltaic elements connected in series according to 18, wherein said insulating layer is a laminate of plural layers.

21. A process for fabricating an array of photovoltaic elements connected in series according to claim 18, wherein the thermal conductivity of said insulating layer is small on the side of light incidence.

22. A process for fabricating an array of photovoltaic elements connected in series according to claim 1 or claim 2, wherein said substrate is an elongated substrate of a band shape.

23. A process according to claim 22, wherein at least during said process steps, said substrate moves.

24. A process according to claim 1 or claim 2, wherein said substrate has a conductive rear surface.

25. A process for fabricating an array of photovoltaic elements connected in series, comprising steps of:

depositing a conductive layer with a high reflectivity to operate as a lower electrode on an elongated substrate with an insulating surface;

depositing a photovoltaic layer and a transparent conductive layer to operate as upper electrodes on said conductive layer with the high reflectivity;

forming, from said conductive layer with a high reflectivity, plural lower electrodes insulated from each other on a plane, forming, from said transparent conductive layer, said upper electrodes insulated from each other on a plane, defining insulatively said conductive layer with the high reflectivity and said transparent conductive layer so that a part of said upper electrode insulatively defined is overlapped with a part of adjacent lower electrode on the plane, said upper and lower electrodes are electrically connected through the overlapping parts, thereby connecting in series, on said elongated substrate, said plural photovoltaic cells comprising the photovoltaic layer arranged between the upper and lower electrodes;

immersing said photovoltaic cells arranged in series connection on said elongated substrate into an electrolyte solution in which a knife edge shaped conductor is positioned as an opposed electrode in close proximity opposite at least one of said upper electrodes of said photovoltaic cells; and applying a voltage between said knife edge shaped opposed electrode and said lower electrode immersed in said electrolyte solution.

26. A process according to claim 25, wherein said electrolyte is a solution of chloride in water.

27. A process according to claim 26, wherein said chloride is aluminum chloride, zinc chloride, lead chloride, or titanium chloride.

* * * * *

UNITED STATES PATENT AND TRADEMARK OFFICE
CERTIFICATE OF CORRECTION

PATENT NO. : 5,798,284

DATED : August 25, 1998

INVENTOR(S) : KATSUMI NAKAGAWA

Page 1 of 2

It is certified that error appears in the above-identified patent and that said Letters Patent is hereby corrected as shown below:

COLUMN 10

Line 52, "B. thereafter" should read --B, and thereafter--.

COLUMN 13

Line 32, "(COD)," should read --(CdO),--;
Line 40, close up right margin.

COLUMN 15

Line 7, "8W." should read --8W,--;
Line 12, "of" should be deleted.

COLUMN 17

Line 38, "steel" should read --steel was--.

UNITED STATES PATENT AND TRADEMARK OFFICE
CERTIFICATE OF CORRECTION

PATENT NO. : 5,798,284
DATED : August 25, 1998
INVENTOR(S) : KATSUMI NAKAGAWA It is certified that error appears in the above-identified patent and that said Letters Patent is hereby corrected as shown below:

COLUMN 18

Line 4, "20 W." should read --20 W,--.

COLUMN 19

Line 14, "shaped" should be deleted.

COLUMN 22

Line 1, "layer" should read --layer is--;
    Line 4, "to" should read --to claim--;
    Line 30, "plane," should read --plane;--;
    Line 32, "plane," should read --plane;--;
    Line 37, "plane," should read --plane;--.

Signed and Sealed this

Twenty-fifth Day of May, 1999

*Attest:*

Q. TODD DICKINSON

*Attesting Officer*     *Acting Commissioner of Patents and Trademarks*